United States Patent [19]

Bader et al.

[11] Patent Number: 5,268,863

[45] Date of Patent: Dec. 7, 1993

[54] MEMORY HAVING A WRITE ENABLE CONTROLLED WORD LINE

[75] Inventors: Mark D. Bader; Kenneth W. Jones; Karl L. Wang; Ray Chang, all of Austin, Tex.

[73] Assignee: Motorola, Inc., Schaumburg, Ill.

[21] Appl. No.: 909,485

[22] Filed: Jul. 6, 1992

[51] Int. Cl.[5] .............................................. G11C 7/00
[52] U.S. Cl. .................... 365/189.01; 365/203
[58] Field of Search ............. 365/189.01, 203, 189.05, 365/233

[56] References Cited

U.S. PATENT DOCUMENTS

| | | | |
|---|---|---|---|
| 4,581,718 | 4/1986 | Oishi | 365/203 |
| 4,916,670 | 4/1990 | Suzuki | 365/189.01 |
| 4,926,387 | 5/1990 | Madland | 365/189.05 |
| 4,975,877 | 12/1990 | Bell | 365/189 |
| 4,995,002 | 2/1991 | Yamada et al. | 365/189 |
| 5,018,111 | 5/1991 | Madland | 365/233 |
| 5,146,427 | 9/1992 | Sasaki | 365/189.05 |
| 5,187,684 | 2/1993 | Hoshino | 365/189.01 |

Primary Examiner—Eugene R. LaRoche
Assistant Examiner—A. Zarabian
Attorney, Agent, or Firm—Daniel D. Hill

[57] ABSTRACT

A memory (20) for performing read cycles and write cycles has memory cells (30) located at intersections of word lines (32) and bit line pairs (34). A write control circuit (44) receives a write enable signal. The logic state of the write enable signal determines whether memory (20) writes data into, or reads data from, memory (20). Memory (20) includes row address decoding for selecting a word line (32). During a write cycle, a control signal generated by write control circuit (44) and single-sided delay circuit (45) is provided to row predecoder (42). The old row address is latched, and a new address is prevented from selecting a new word line (32) until the write enable signal changes state to begin a read cycle. Controlling word line selection with the write enable signal ensures that bit line equalization occurs before the beginning of a read cycle.

19 Claims, 5 Drawing Sheets

MEMORY HAVING A WRITE ENABLE CONTROLLED WORD LINE

CROSS-REFERENCE TO RELATED, COPENDING APPLICATION

A related, copending application is entitled "ECL-TO-CMOS Buffer Having a Single-Sided Delay", by Kenneth W. Jones et al., Ser. No. 7/909,484, assigned to the assignee hereof, and filed concurrently herewith.

FIELD OF THE INVENTION

This invention relates generally to integrated circuit memories, and more particularly, to integrated circuit memories having write enable controlled word lines.

BACKGROUND OF THE INVENTION

An integrated circuit memory, such as a static random access memory (SRAM), is generally implemented as an array of memory cells in a plurality of rows and columns. An array may be subdivided into blocks of memory cells. The memory cells are addressable through block, row, and column decoders for reading data from the memory cells or writing data into the memory cells. Each memory cell has a unique address at an intersection of a row and a column. The bit line pairs are commonly used for both reading data from, and writing data into, the memory cell. Typically, data is read from memory when a write enable signal is at a logic high (or inactive), and written into memory when the write enable signal is at a logic low, (or active). During a read cycle, a word line selects the addressed row of memory cells, and a pair of complementary bit lines communicate the data bit between the addressed row and a sense amplifier. The data exists as a relatively small differential voltag on the pair of complementary bit lines. A sense amplifier detects and amplifies the differential voltage and communicates it to the data output stage of the integrated circuit memory via read global data lines.

During a write cycle, a relatively large differential signal is provided on the bit lines in order to over-write the contents of a selected memory cell. At the end of a write cycle, the differential voltage remaining on the bit line pair must be reduced to a relatively low level so that the data is not erroneously written into a memory cell during the following read cycle. The differential voltage on the bit line pair must also be reduced quickly so that the read cycle is not unnecessarily extended. This process is called write recovery, or bit line equalization. Bit line equalization causes the voltages on the bit line pair to be close enough so that data is not overwritten and that the correct data is sensed quickly during the read cycle. Write recovery of the bit line pairs is embodied in a timing specification known as TWHAX (write signal high to an address invalid). TWHAX is essentially the time interval between the beginning of a read cycle, and the change of the address to select a different location in the memory array. During that time, write recovery, or bit line equalization occurs to prevent data from being overwritten during the following read cycle. The time period for write recovery must be long enough to allow bit line equalization to occur, but not so long that the read cycle is unnecessarily delayed. A minimum time of zero is usually given as the TWHAX timing specification.

If an address changes before the write enable signal becomes a logic high, TWHAX is considered to be negative, and bit line equalization may not be complete before the word line changes, thus causing a data reliability problem. This problem is more severe if the address selects a new word line within the same block as the previous word line, because less time is needed for address changes when they are within a block. For guard banding purposes, the TWHAX specification must not only be met, but exceeded. It is desirable that the memory ignore address changes that occur a few nanoseconds before the write cycle to read cycle change, because the user may have difficulty ensuring that the address does not change before the write enable signal changes. These difficulties may arise from the user's own timing circuitry as well as printed circuit board layout problems.

SUMMARY OF THE INVENTION

Accordingly, there is provided, in one form, an integrated circuit memory having a write cycle and a read cycle. The write cycle is indicated by a write enable signal being in a first logic state, for writing data into a selected memory cell via a selected bit line pair. The read cycle is indicated by the write enable signal being in a second logic state, for reading data provided onto a selected bit line pair. A plurality of memory cells are coupled to word lines and bit line pairs. Each memory cell receives data from the bit line pair to which it is coupled, when the word line to which it is coupled is enabled. A row decoding portion receives a row address signal and enables a word line in response to the row address. A bit line equalization portion is coupled to the bit line pairs. The bit line equalization portion equalizes the voltages on the bit line pairs at the termination of a write cycle. A circuit is included for preventing the row address signal from selecting a different one of said word lines until the write enable signal changes from the first logic state to the second logic state. These and other features and advantages will be more clearly understood from the following detailed description taken in conjunction with the accompanying drawings.

DESCRIPTION OF A PREFERRED EMBODIMENT

Figure 1:
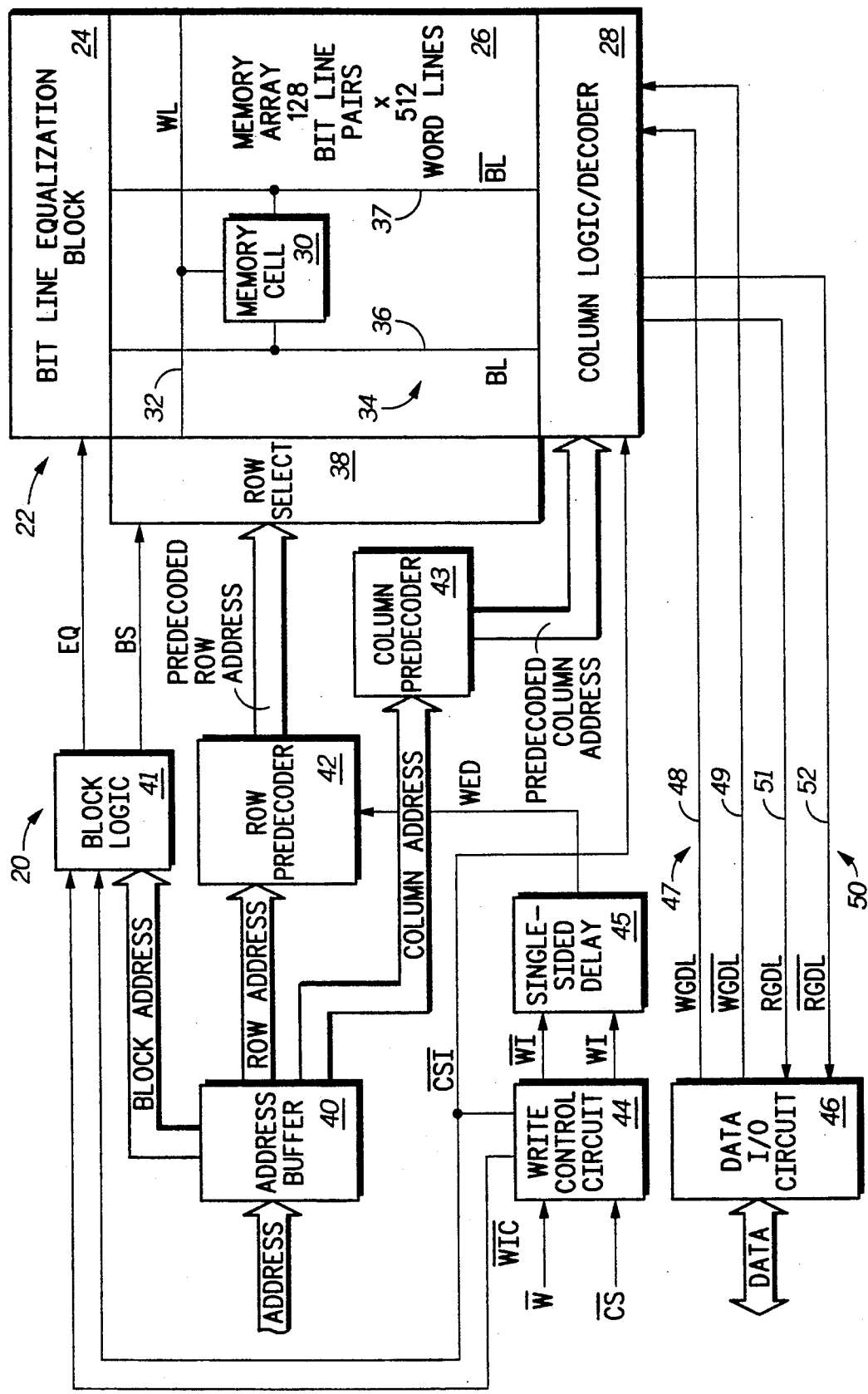
FIG. 1 illustrates in block diagram form an integrated circuit memory in accordance with the present invention.

FIG. 1 illustrates in block diagram form memory 20 in accordance with the present invention. Memory 20 includes memory block 22, row select circuitry 38, address buffer 40, row predecoder 42, block logic 41, column predecoder 43, write control circuit 44, single-sided delay circuit 45, data I/O circuitry 46, write global data lines 47 and read global data lines 50. Memory block 22 includes bit line equalization block 24, memory array 26, column logic/decoder 28, memory cell 30, word line 32, and bit line pair 34. Memory block 22 is a representative memory block of memory 20 and there may be other memory blocks present in memory 20. Memory array 26 includes 128 bit line pairs and 512 word lines. Memory cells are located at intersections of word lines and bit line pairs. A representative memory cell 30 is illustrated in FIG. 1 connected to word line 32 and bit line pair 34. Bit line pair 34 includes bit lines 36 and 37. Write global data lines 47 includes a write global data line 48 and a write global data line 49. Read global data lines 50 includes a read global data line 51 and a read global data line 52.

Write control circuit 44 receives an ECL (emitter-coupled logic) level external write enable signal labeled "W" and an ECL level external chip select signal labeled "$\overline{CS}$". In response, write control circuit 44 provides a core write signal labeled "$\overline{WIC}$", an internal chip select signal labeled "$\overline{CSI}$", and differential internal write signals labeled "WI" and "$\overline{WI}$", respectively. Single-sided delay circuit 45 receives internal write signals WI and $\overline{WI}$ and provides a single-sided delay control signal labeled "WED" at CMOS (complementary metal-oxide-semiconductor) logic levels.

For ECL applications, $V_{DD}$ is the system ground with $V_{SS}$ equal to a negative power supply voltage, generally equal to $-5.2$ volts. An ECL logic high voltage is equal to substantially $V_{DD}$ minus one base-emitter diode voltage drop ($V_{BE}$), and an ECL logic low voltage is equal to $V_{DD}-2V_{BE}$. CMOS logic levels may swing the full rail of the power supply voltage.

Address buffer 40 receives an address signal labeled "ADDRESS", and provides a buffered differential row address labeled "ROW ADDRESS", a buffered differential block address labeled "BLOCK ADDRESS", and a buffered differential column address labeled "COLUMN ADDRESS". Block logic 41 receives block address signals BLOCK ADDRESS, core write signal $\overline{WIC}$, and internal chip select signal $\overline{CSI}$, and in response provides a bit line equalization signal labeled "EQ" to bit line equalization block 24 and a block select signal labeled "BS" to row select 38. In other embodiments, different numbers of blocks, different sizes of blocks and different word widths could be used. Block logic 41 will provide block select signals and bit line equalization signals to the other memory blocks as well.

Row predecoder 42 receives differential row address signals ROW ADDRESS and single-sided delay control signal WED. In response, row predecoder 42 provides a plurality of predecoded row address signals labeled "PREDECODED ROW ADDRESS" to row select 38. Column predecoder 43 receives differential column address signals COLUMN ADDRESS, and in response provides a plurality of predecoded column address signals labeled "PREDECODED COLUMN ADDRESS" to column logic/decoder 28. The particular address signals received by row predecoder 42 and column predecoder 43 have no special significance and may be different in other embodiments. Also, the amount of decoding performed by the row and column predecoders may be different in other embodiments.

In one embodiment, memory block 22 is one of 64 memory blocks, and the 64 blocks are grouped into four quadrants of 16 blocks each. The other memory blocks are not shown for the purposes of clarity and simplicity.

In memory block 22, row select 38 receives block select signal BS and a predecoded row address, and in response selects one of the 512 word lines. Memory cells in memory array 26 are located at intersections of 512 word lines and 128 bit line pairs. Each memory cell is coupled to a word line and a bit line pair. Each bit line pair serves as an input to the memory cells during the write cycle of memory 20 and as an output during the read cycle. A representative memory cell 30 is shown coupled to word line 32, and to bit line pair 34. Bit line equalization block 24 receives equalization signal EQ from block logic 41, and is coupled to each of 128 bit line pairs of memory array 26. Block logic 41 provides block select signals BS to select one of the memory blocks.

Column logic/decoder 28 is coupled to each bit line pair, including representative bit line pair 34, and is coupled to read global data line pair 50 and write global data line pair 47. During a write cycle, data I/O circuit 46 receives single-ended data labeled "DATA", and provides differential data signals labeled "WGDL" and "$\overline{WGDL}$" to write global data lines 48 and 49, respectively. During a read cycle, data I/O circuit 46 receives differential data signal labeled "RGDL" and "$\overline{RGDL}$" to read global data lines 51 and 52, respectively, and provides single-ended data signals DATA. In a preferred embodiment, memory 20 is configured with a word width of X1. However, memory 20 could also be configured with a word width of X2, X4, or X8. The other read global data lines and write global data lines to support other word widths are not shown for ease of illustration.

For a word width of X1, memory 20 receives 22 address signals, A0–A21. Address buffer 40 provides column address signals A0–A3, block address signals A4–A7, row address signals A10–A16, quad address signals A17 and A18 to select one of the four quadrants, and X1 option address signals A19–A21. Fewer address signals are necessary to configure memory 20 for other word widths.

To read data from memory 20, write control circuit 44 receives external chip select signal $\overline{CS}$ as an ECL logic low (active), and external write enable signal labeled $\overline{W}$ as an ECL logic high (inactive). Note that a bar, or overline, over the signal name indicates that the signal is active at a logic low. In response to receiving internal write control signals WI and $\overline{WI}$, single-sided delay circuit 45 provides single-sided delay control signal WED as a logic low during the read cycle. Internal write signals WI and $\overline{WI}$ and internal chip select signal $\overline{CSI}$ are buffered from write enable signal $\overline{W}$ and chip select signal $\overline{CS}$, respectively. Block select signal BS is decoded from block address signals BLOCK ADDRESS and selects memory block 22 of memory 20. Only one memory block can be selected at a time. Row predecoder 42 receives a row address decoded from buffered differential row address signals ROW ADDRESS, and provides a predecoded row address labeled "PREDECODED ROW ADDRESS" to row select 38, to select one of the 512 word lines, of which word line 32 is an example. There are 128 memory cells coupled to each word line. Each memory cell that is coupled to the selected word line provides its output as a differential voltage on a corresponding bit line pair. Predecoded column address signals PREDECODED COLUMN ADDRESS are provided to column logic/decoder 28. For a word width of X1, column logic/decoder 28 selects one bit line pair of the 128 bit line pairs, for example, bit line pair 34. When bit line pair 34 is selected, column logic/decoder 28 then senses and amplifies the relatively small differential voltage provided to bit line pair 34 by memory cell 30 and couples the selected bit line to read global data line pair 50. Read global data line pair 50 is representative of the eight read global data line pairs in memory 20. Data I/O circuit 46 receives a differential signal from read global data line pair 50 corresponding to the differential signal from bit line pair 34, and provides single ended data signal DATA. The differential voltage during a read cycle is approximately 300 millivolts.

During a write cycle, the flow of data is essentially reversed. To write data into memory 20, chip select signal $\overline{CS}$ is a logic low (active), and write enable signal $\overline{W}$ changes state from a logic high to a logic low. Data I/O circuit 46 receives a data bit to be written into memory 20, and provides the data bit as a differential signal on a corresponding write global data line pair 47. Write global data line pair 47 is representative of the eight write global data line pairs in memory 20. Block logic 41 selects the memory block that is to receive the data bit. Column predecoder 43 provides the predecoded column address to column logic/decoder 28 which couples a write global data line pair to a bit line pair. Row predecoder provides a predecoded row address to row select 38 which selects one of 512 word lines. As in the read cycle, memory cells located on an enabled word line provide data to bit line pairs. However, a voltage differential driven on bit line pairs by column logic/decoder 28 is greater than the drive voltage of the memory cell and overwrites a stored bit in the memory cell. The differential voltage driven onto the bit line pairs during the write cycle is approximately 3.0 volts. At the end of a write cycle the differential voltage on the bit line pair must be reduced to a level small enough so that the data is not erroneously written into a memory cell during the following read cycle. Equalization of the bit line pairs is achieved by bit line equalization block 24.

The write cycle ends in response to write enable signal $\overline{W}$ becoming a logic high. The differential voltage on the selected bit line pair must be equalized before the address changes the word line. This time period is specified by the TWHAX specification. The TWHAX time period is illustrated in the timing diagram of FIG. 3. Sometimes, for various reasons, TWHAX is of insufficient duration to allow bit line equalization before the word line changes. If the word line changes before bit line equalization occurs, the data being written during the write cycle may be written into the selected memory cell during the next read cycle, causing a data reliability problem.

Single-sided delay circuit 45 provides single-sided delay control signal WED to row predecoder 42 to prevent the predecoded row address from changing before bit line equalization occurs. The old predecoded row address is latched, and the new predecoded row address is prevented from leaving row predecoder 42 until single-sided delay control signal WED becomes a logic low. In the preferred embodiment, the address is latched in row predecoder 42. In other embodiments, the row address can be latched anywhere between address buffer 40 and row select 38. In determining where to latch the address, the number of address signals in the memory, the current loading on each signal path, and the layout of the integrated circuit memory must be considered. Also, in other embodiments, the column address may be latched instead of the row address.

Figure 4:
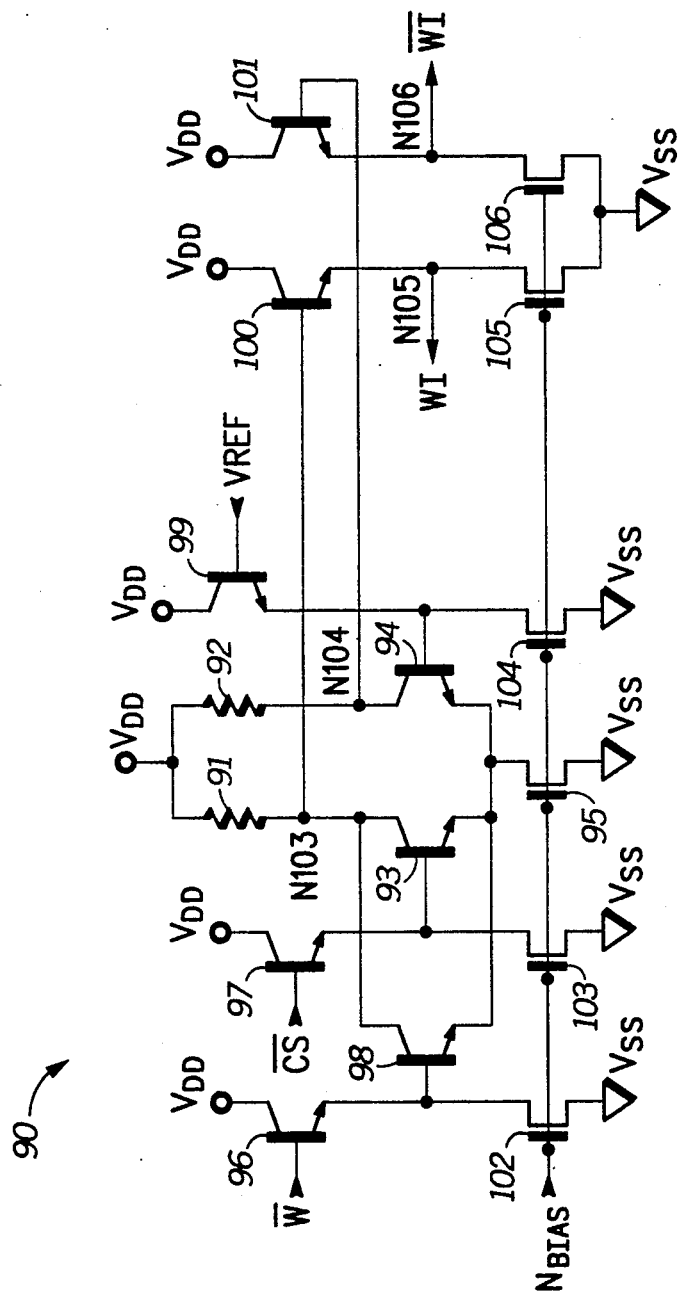
FIG. 4 illustrates in partial block diagram form and partial schematic form a portion of the write control circuit of the memory of FIG. 1 in accordance with the present invention.

Single-sided delay control signal WED is active at a logic high. When write enable signal $\overline{W}$ changes from a logic high to a logic low, control signal WED changes from a logic low to a logic high. When write enable signal $\overline{W}$ changes from a logic high to a logic low, single sided delay circuit 45 delays the transition of single-sided delay control signal WED from a logic low to a logic high. Hence the name, single-sided delay. The circuit that provides single-sided delay control signal WED is illustrated in FIG. 4 and will be discussed later. Controlling word line selection with the write enable signal prevents a new address from rippling through before bit line equalization has occurred, thus preventing TWHAX failure.

Figure 2:
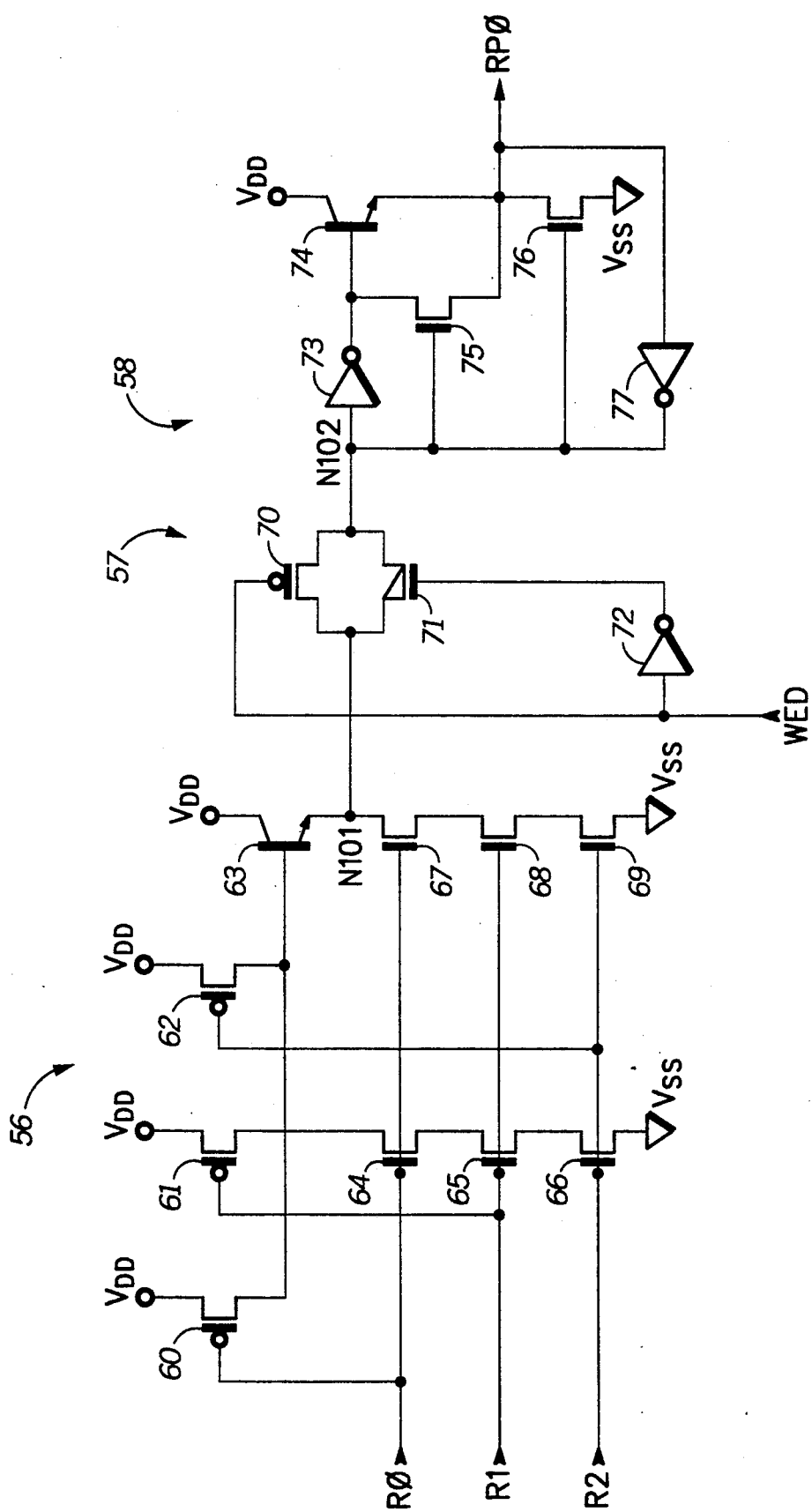
FIG. 2 illustrates in partial block diagram form and partial schematic form a portion of the row predecoder of FIG. 1 in accordance with the present invention.

FIG. 2 illustrates in partial block diagram form and partial schematic form, a row predecoder portion 42a of row predecoder 42 of FIG. 1 in accordance with the present invention. Row predecoder 42 includes a plurality of row predecoder circuits represented by row predecoder 42a of FIG. 2. In one embodiment, seven differential address signals are provided by address buffer 40 to row predecoder 42. Twenty-four row predecoder 42a circuit portions in row predecoder 42 receive these seven differential address signals and provide 24 predecoded row address signals.

Row predecoder 42a includes three input NAND gate 56, pass gate 57, and latch portion 58. NAND gate 56 includes P-channel transistors 60, 61, and 62, N-channel transistors 64, 65, 66, 67, 68, and 69, and NPN transistor 63. P-channel transistor 60 has a source connected to a positive power supply voltage terminal labeled "$V_{DD}$", a gate for receiving an input signal labeled "R0", and a drain. P-channel transistor 61 has a source connected to $V_{DD}$, a gate for receiving an input signal labeled "R1", and a drain connected to the drain of transistor 60. P-channel transistor 62 has a source connected to $V_{DD}$, a gate for receiving an input signal labeled "R2", and a drain connected to the drain of transistor 61. NPN transistor 63 has a collector connected to $V_{DD}$, a base connected to the drain of transistor 62, and an emitter connected to a node labeled "N101". N-channel transistor 64 has a drain connected to the drains of transistors 60, 61, and 62, a gate connected to the gate of transistor 60, and a source. N-channel transistor 65 has a drain connected to the source of transistor 64, a gate connected to the gate of transistor 61, and a source. N-channel transistor 66 has a drain connected to the source of transistor 65, a gate connected to the gate of transistor 62, and a source connected to a negative power supply voltage terminal labeled "$V_{SS}$". N-channel transistor 67 has a drain connected to the emitter of transistor 63 at node N101, a gate connected to the gate of transistor 64, and a source. N-channel transistor 68 has a drain connected to the source of transistor 67, a gate connected to the gate of transistor 65, and a source. N-channel transistor 69 has a drain connected to the source of transistor 68, a gate connected to the gate of transistor 66, and a source connected to $V_{SS}$.

Pass gate 57 includes P-channel transistor 70, N-channel transistor 71, and inverter 72. P-channel transistor 70 has a first drain/source terminal connected to the emitter of transistor 63 at node N101, a second drain/source terminal connected to a node labeled "N102", and a gate for receiving single-sided control signal WED. N-channel transistor 71 has a first drain/source terminal connected to the first drain/source terminal of transistor 70 at node N101, a second drain/source terminal connected to the second drain/source terminal of transistor 70 at node N102, and a gate. Inverter 72 has an input terminal connected to the gate of transistor 70 and an output terminal connected to the gate of transistor 71.

Latch portion 58 includes inverters 73 and 77, NPN transistor 74, and N-channel transistor 75 and 76. Inverter 73 has an input terminal connected to the second drain/source terminal of transistor 70 at node N102 and an output terminal. NPN transistor 74 has a collector connected to $V_{DD}$, a base connected to the output terminal of inverter 73, and an emitter for providing an output signal labeled "RPO". N-channel transistor 75 has a drain connected to the base of transistor 74, a gate connected to the input terminal of inverter 73 at node N102, and a source connected to the emitter of transistor 74. N-channel transistor 76 has a drain connected to the emitter of transistor 74, a gate connected to the input terminal of inverter 73 at node N102, and a source connected to $V_{SS}$. Inverter 77 has an input terminal connected to the emitter of transistor 74 and an output terminal connected to the input terminal of inverter 73 at node N102.

Row predecoder portion 42a receives three input signals R0, R1, and R2, and provides output signal RP0 to row select 38. Row predecoder 42a is representative of the plurality of row predecoders in memory 20. The number of row predecoders in memory 20 is determined by the number of row address signals and the number of rows in each memory block 22. Input signals R0, R1, and R2 represent three of the buffered address signals provided by address buffer 40, and output signal RP0 represents one of the predecoded row address signals provided by row predecoder 42.

NAND gate 56 is a conventional BICMOS NAND gate and receives three CMOS logic level input signals R0, R1, and R2, which corresponding to three of buffered row address signals ROW ADDRESS, and in response provides a signal at node N101 as a logical NAND of input signals R0, R1, and R2. When at least one of input signals R0, R1, and R2 is a logic low input to NAND gate 56, the signal at node N101 is a logic high. Only if all of input signals R0, R1, and R2 are a logic high will the signal at node N101 be a logic low. Input signals R0, R1, and R2 are at CMOS logic levels, however, a NAND gate using different logic levels (such as ECL) may be used.

For the case in which one of input signals R0, R1, and R2 is a logic low and the other signals are logic high voltages, at least one of P-channel transistors 60–62 is conductive, at least one of series connected N-channel transistors 64–66 is non-conductive, and at least one of series connected transistors 67–69 is non-conductive. Therefore, the base of transistor 63 is pulled to approximately $V_{DD}$, and the logic high voltage at node N101 is equal to the voltage at the base of transistor 63 minus one base-emitter diode voltage drop ($V_{BE}$) across transistor 63. When all of input signals R0, R1, and R2 are logic high voltages, all of P-channel transistors 60–62 are non-conductive and all of N-channel transistors 64–66 are conductive, thus pulling the base of transistor 63 to $V_{SS}$. Transistor 63 is non-conductive, so that the voltage at node N101 is pulled to a logic low voltage of approximately $V_{SS}$ through transistor 67–69.

When pass gate 57 receives single-sided delay control signal WED as a logic low, (indicating a read cycle), P-channel transistor 70 is conductive. Inverter 72 receives signal-sided delay control signal WED as a logic low voltage and provides a logic high voltage to N-channel transistor 71, making transistor 71 conductive. When transistors 70 and 71 are switched on, (or conductive), there is a conductive path between nodes N101 and N102 making the voltage at node N102 approximately equal to the voltage at node N101. Latch portion 58 receives a signal through pass gate 57 at node N102 when single-sided delay control signal WED is a logic low, and provides output signal RP0.

When pass gate 57 receives single-sided delay control signal WED as a logic high voltage, (indicating a write cycle), P-channel transistor 70 and N-channel transistor 71 are switched off, (or non-conductive), preventing the voltage level at node N102 from being affected by the voltage at node N101. Therefore, pass gate 57 effectively decouples row predecoder 42a from row select 38. Latch portion 58 holds output signal RP0 at a logic level corresponding to the logic level before single-sided delay control signal WED became a logic high. Latch portion 58 holds the logic level of output signal RP0 until single-sided delay control signal WED becomes a logic low, thus causing a conductive path to form between nodes N101 and N102.

N-channel transistor 71 is shown as a low threshold N-channel transistor in the embodiment illustrated in FIG. 2 to decrease the switching delay of pass gate 57. Low threshold N-channel transistor 71 has a threshold voltage ($V_T$) of about 0.5 volts. In other embodiments, a normal N-channel transistor may be substituted for low threshold N-channel transistor 71.

If the voltage at node N102 is a logic high, the output of inverter 73 is a logic low and transistor 74 is switched off, (or non-conductive). Transistor 75 is conductive and helps to prevent base-emitter reverse bias of transistor 74. Transistor 76 is conductive, thus reducing the voltage at the emitter of transistor 74 to $V_{SS}$, so that output signal RP0 is a logic low equal to approximately $V_{SS}$. Inverter 77 receives a logic low voltage and reinforces the logic high at node N102. Inverter 77 therefore "latches" the logic level of output signal RP0. Inverter 77 is sized to provide a weak latch so that the logic level maintained by latch portion 58 can be overwritten when pass gate 57 is conductive, allowing a new address signal to pass.

If the voltage at node N102 is a logic low, the output of inverter 73 is a logic high and transistor 74 is conductive. Both transistors 75 and 76 are non-conductive, allowing output signal RP0 to be pulled to a logic high. The voltage received by inverter 77 is a logic high, so that a logic low output is provided to node N102 to provide a weak latch for the logic low voltage at node N102 that can be overwritten when pass gate 57 is conductive and allows a new signal to pass.

Figure 3:
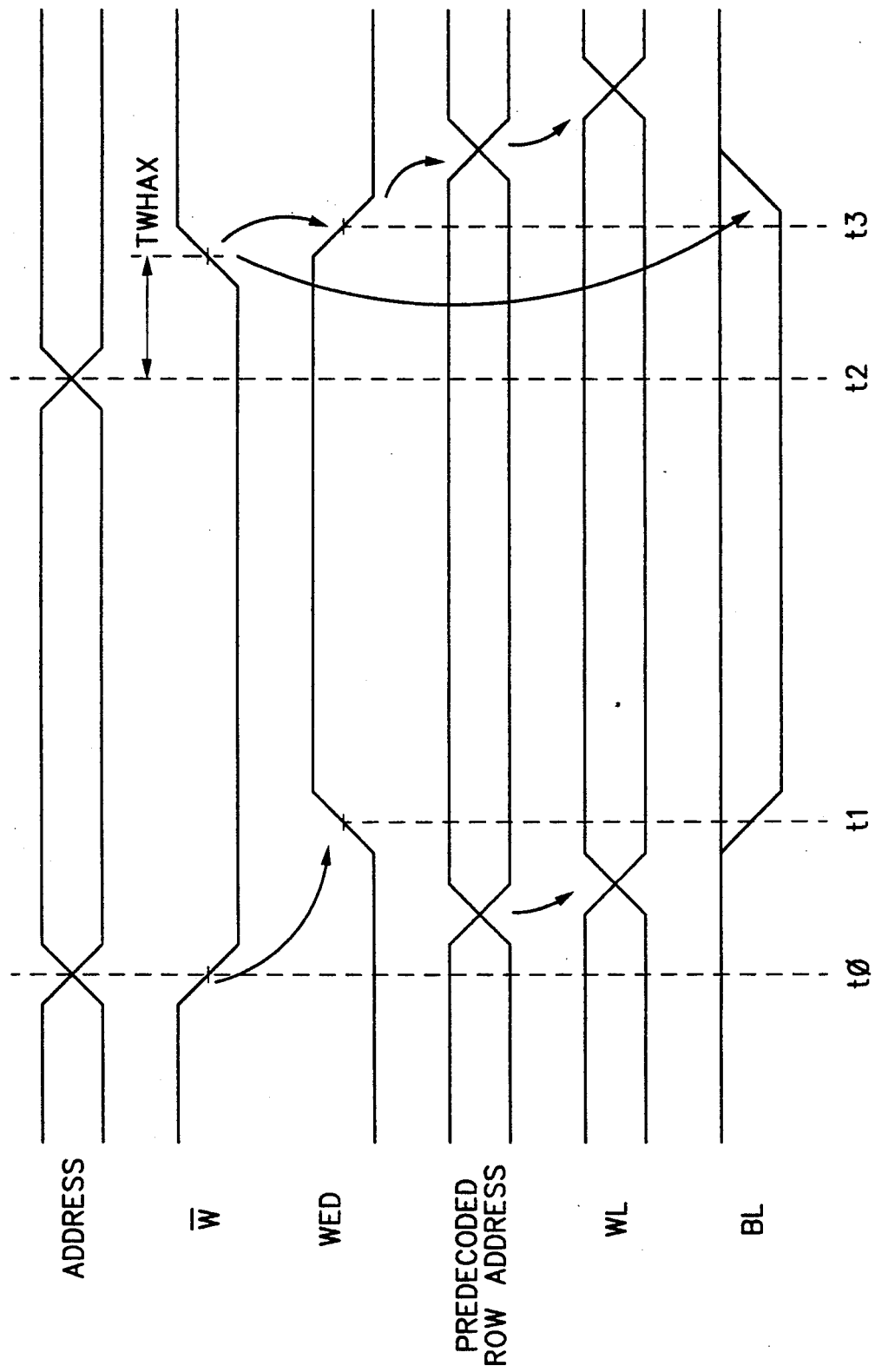
FIG. 3 shows a timing diagram of various signals of the memory of FIG. 1 in accordance with the present invention.

FIG. 3 shows a timing diagram of some of the various signals of memory 20 of FIG. 1. Note that the time intervals and logic levels illustrated in FIG. 3 are not drawn to scale and are only intended to represent the sequence and relationship of some of the signals during a write cycle of memory 20. At time t0, the address changes and write enable signal $\overline{W}$ changes from a logic high to a logic low, thus indicating the start of a write cycle. Note that in other embodiments, write enable signal $\overline{W}$ may become a logic low at some time after time t0. In response to the address changing, the predecoded row address changes after a relatively short propagation delay. Also, the word line (WL) changes in response to, and after the predecoded row address changes. Single-sided delay control signal WED changes from a logic low to a logic high at time t1, after a predetermined delay, in response to write enable signal $\overline{W}$ changing from a logic high to a logic low. At time t1, single-sided delay control signal WED causes the predecoded row address to be latched. The length of the predetermined delay is long enough to ensure that there is a valid predecoded row address before the predecoded row address is latched.

The time interval between the address changing at time t2 and write enable signal $\overline{W}$ becoming a logic high is known as the TWHAX specification. Normally write enable signal $\overline{W}$ becomes inactive at the same time, as or before the address changes, in which case TWHAX is zero. In the case illustrated by FIG. 3, TWHAX is negative, i.e., write enable signal $\overline{W}$ becomes inactive after the address changes. If this occurs, bit line equalization may not be concluded before the word line changes, causing data to be written into the memory cell selected by the new word line, thus destroying the data. In the preferred embodiment, the row address is latched in row predecoder 42. This prevents the word line (WL) from changing until after time t3, when signal-sided delay control signal WED transitions to a logic low. This ensures that bit line (BL) equalization always occurs before the word line changes.

FIG. 4 illustrates in partial schematic diagram from and partial block diagram form a portion of write control circuit 44 of memory 20 of FIG. 1 in accordance with the present invention. Write control circuit 44 includes ECL logic gate 90. Additional circuitry is included in write control circuit 44 to provide internal core write signal $\overline{WIC}$ and internal chips select signal CSI, but is not shown in FIG. 4. ECL logic gate 90 is a conventional ECL logic gate and includes resistors 91 and 92, NPN transistors 93, 94, and 96-101, and N-channel transistors 95 and 102-106. Resistor 91 has a first terminal connected to a positive power supply voltage terminal labeled "$V_{DD}$" and a second terminal connected to a node labeled "N103". Resistor 92 has a first terminal connected to $V_{DD}$ and a second terminal connected to a node labeled "N104". NPN transistor 93 has a collector connected to the second terminal of resistor 91 at node N103, a base, and an emitter. NPN transistor 94 has a collector connected to the second terminal of resistor 92 at node N104, a base, and an emitter connected to the emitter of transistor 93. N-channel transistor 95 has a drain connected to the emitters of transistors 93 and 94, a gate for receiving a bias voltage labeled "$N_{BIAS}$", and a source connected to a negative power supply voltage terminal labeled "$V_{SS}$". NPN transistor 96 has a collector connected to $V_{DD}$, a base for receiving external write enable signal $\overline{W}$, and an emitter. NPN transistor 97 has a collector connected to $V_{DD}$, a base for receiving external chip select signal $\overline{CS}$, and an emitter connected to the base of transistor 93. N-channel transistor 102 has a drain connected to the emitter of transistor 96, a gate for receiving $N_{BIAS}$, and a source connected to $V_{SS}$. NPN transistor 98 has a collector connected to the second terminal of resistor 91 at node N103, a base connected to the emitter of transistor 96, and an emitter connected to the emitters of transistors 93 and 94. N-channel transistor 103 has a drain connected to the emitter of transistor 97, a gate for receiving bias voltage $N_{BIAS}$, and a source connected to $V_{SS}$. NPN transistor 99 has a collector connected to $V_{DD}$, a base for receiving a reference voltage labeled "VREF", and an emitter connected to the base of transistor 94. N-channel transistor 104 has a drain connected to the emitter of transistor 99, a gate for receiving bias voltage $N_{BIAS}$, and a source connected to $V_{SS}$. NPN transistor 100 has a collector connected to $V_{DD}$, a base connected to the collector of transistor 93 at node N103, and an emitter connected to a node labeled "N105" for providing an internal write signal labeled "WI". N-channel transistor 105 has a drain connected to the emitter of transistor 100 at node N105, a gate for receiving bias voltage $N_{BIAS}$, and a source connected to $V_{SS}$. NPN transistor 101 has a collector connected to $V_{DD}$, a base connected to the collector of transistor 94 at node N104, and an emitter connected to a node labeled "N106" for providing an internal write signal labeled "$\overline{WI}$". N-channel transistor 106 has a drain connected to the emitter of transistor 101 at node N106, a gate for receiving bias voltage $N_{BIAS}$, and a source connected to $V_{SS}$. The operation of ECL logic gate 90 will be described later in the discussion of FIG. 5.

Figure 5:
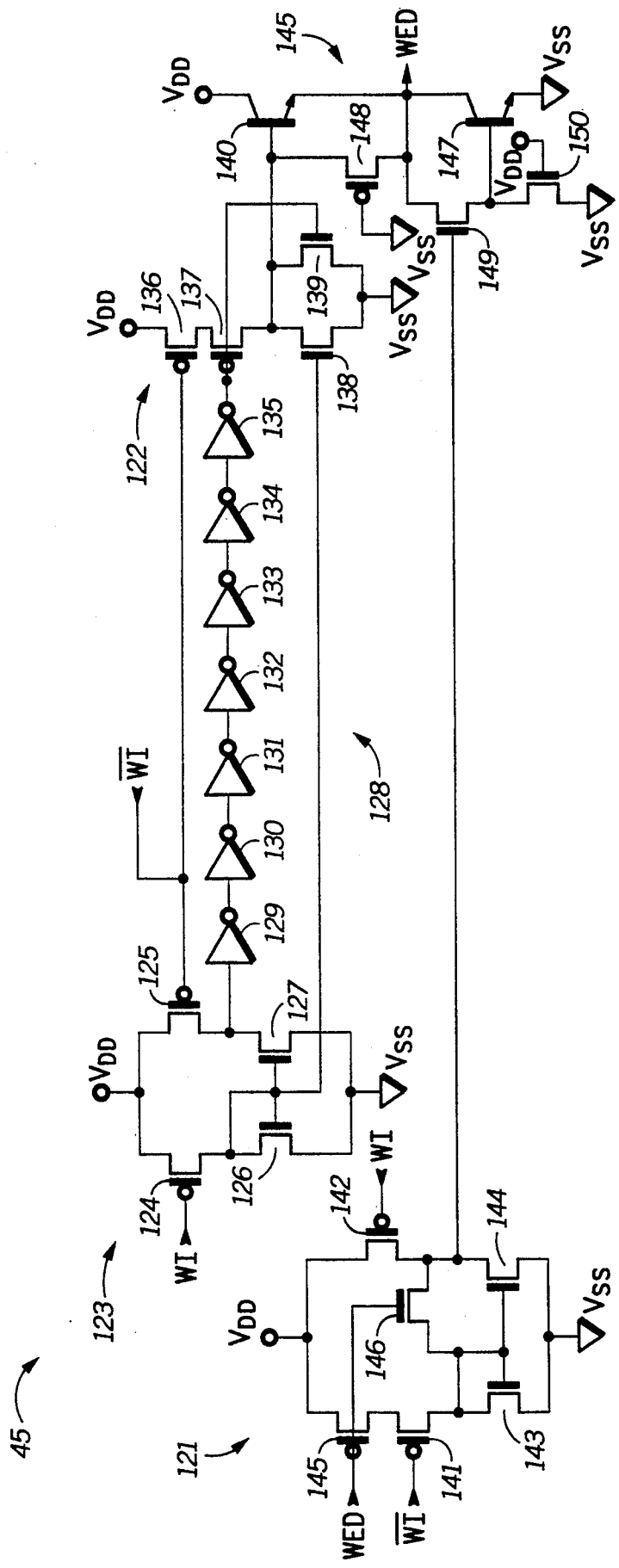
FIG. 5 illustrates in schematic form the single-sided delay circuit of the memory of FIG. 1 in accordance with the present invention.

FIG. 5 illustrates in schematic form single-sided delay circuit 45 of the memory of FIG. 1 in accordance with the present invention. Single-sided delay circuit 45 includes level converter 123, low power level converter 121, delay stage 128, and output stage 145. Level converter 123 includes P-channel transistors 124 and 125 and N-channel transistors 126 and 127. P-channel transistor 124 has a source connected to $V_{DD}$, a gate for receiving internal write signal WI, and a drain. P-channel transistor 125 has a source connected to $V_{DD}$, a gate for receiving internal write signal $\overline{WI}$, and a drain. N-channel transistor 126 has a drain and a gate connected to the drain of transistor 124, and a source connected to $V_{SS}$. N-channel transistor 127 has a drain connected to the drain of transistor 125, a gate connected to the drain of transistor 124, and a source connected to $V_{SS}$.

Delay stage 128 includes inverters 129-135, P-channel transistors 136 and 137, and N-channel transistors 138 and 139. Transistors 136-139 form NOR gate 122. Inverters 129-135 are connected in series with the input terminal of inverter 129 connected to the drain of transistor 125. The output of inverter 129 is connected to the input of inverter 130, and so forth. P-channel transistor 136 has a source connected to $V_{DD}$, a gate connected to the gate of transistor 125 and for receiving internal write signal $\overline{WI}$, and a drain. P-channel transistor 137 has a source connected to the drain of transistor 136, a gate connected to the output of inverter 135, and a drain. N-channel transistor 138 has a drain connected to the drain of transistor 137, a gate connected to the drain of transistor 124, and a source connected to $V_{SS}$. N-channel transistor 139 has a drain connected to the drain of transistor 137, a gate connected to the gate of transistor 137, and a source connected to $V_{SS}$.

Low power level converter 121 includes P-channel transistors 141, 142, and 145 and N-channel transistors 143, 144, and 146. P-channel transistor 145 has a source connected to $V_{DD}$, a gate for receiving single-sided delay control signal WED, and a drain. P-channel transistor 141 has a source connected to the drain of transistor 145, a gate for receiving internal write signal $\overline{WI}$, and a drain. P-channel transistor 142 has a source connected to $V_{DD}$, a gate for receiving internal write signal WI, and a drain. N-channel transistor 143 has a drain and a gate connected to the drain of transistor 141, and a source connected to $V_{SS}$. N-channel transistor 144 has a drain connected to the drain of transistor 142, a gate connected to the drain of transistor 141, and a source connected to $V_{SS}$. N-channel transistor 146 has a first drain/source terminal connected to the drain of transistor 141, a gate connected to the gate of transistor 145 for receiving single-sided delay control signal WED, and a second drain/source terminal connected to the drain of transistor 142.

Output stage 145 includes NPN transistors 140 and 147, P-channel transistor 148, and N-channel transistors 149 and 150. NPN transistor 140 has a collector connected to $V_{DD}$, a base connected to the drain of transistor 137, and an emitter for providing single-sided delay control signal WED. NPN transistor 147 has a collector connected to the emitter of transistor 140, a base, and an emitter connected to $V_{SS}$. P-channel transistor 148 has a source connected to the base of transistor 140, a gate connected to $V_{SS}$, and a drain connected to the emitter of transmitter 140. N-channel transistor 149 has a drain connected to the emitter of transistor 140, a gate connected to the drain of transistor 142, and a source connected to the base of transistor 147. N-channel transistor 150 has a drain connected to the base of transistor 147, a gate connected to $V_{DD}$, and a source connected to $V_{SS}$.

Referring again to ECL logic gate 90 of FIG. 4, transistors 96 and 102 form an emitter-follower input circuit which drops the voltage received at the base of transistor 98 to one $V_{BE}$ (approximately 0.8 volts) below the voltage of write enable signal $\overline{W}$. Transistors 97 and 103 form another emitter-follower input circuit which drops the voltage received at the base of transistor 93 to one $V_{BE}$ below chip enable signal $\overline{CS}$. A differential amplifier is formed by resistors 91 and 92, transistors 93 and 94, and transistor 95. A reference voltage VREF is received at the base of transistor 99 which drops reference voltage VREF one $V_{BE}$ before it is provided to the base of transistor 94. The collector of transistor 93 provides a logical NOR output signal at node N103 of write enable signal $\overline{W}$ and chip select signal $\overline{CS}$. The collector of transistor 94 provides a logical OR output signal at node N104 of write enable signal $\overline{W}$ and chip select signal $\overline{CS}$. Reference voltage VREF is chosen so the voltage received by the base of transistor 94 is at the midpoint of the logic swings of write enable signal $\overline{W}$ and chip select signal $\overline{CS}$. Transistors 100 and 105 form an emitter-follower output portion which is connected to the collector of transistor 93 at node N103. Transistors 101 and 106 form an emitter-follower output portion which is connected to the collector of transistor 94 at node N104. Internal write signals WI and $\overline{WI}$ are complementary internal logic signals and are provided at intermediate, or analog, logic levels.

During a read cycle of memory 20, ECL logic gate 90 receives ECL level write enable signal $\overline{W}$ as a logic high and chip select signal $\overline{CS}$ as a logic low. Transistor 93 is non-conductive and transistor 98 is conductive. A current through transistor 95, designated as $I_{95}$, is steered through transistor 98 so that the voltage at node N103 is equal to a logic low voltage of $V_{DD}$ minus $I_{95}R_{91}$, where $R_{91}$ is the resistance of resistor 91. The voltage at node N104 is a logic high, approximately equal to $V_{DD}$. Internal write signal WI is a logic low voltage equal to the voltage at node N103 minues one $V_{BE}$ across transistor 100, and internal write signal $\overline{WI}$ is a logic high voltage equal to the voltage at node N104 minus one $V_{BE}$ across transistor 101.

Single-sided delay circuit 45 provides single-sided delay control signal WED at a CMOS level logic high voltage in response to write enable signal $\overline{W}$ and chip select signal $\overline{CS}$ both being at ECL logic low voltages (indicating a write cycle). When write enable signal $\overline{W}$ is an ECL logic high voltage and chip select signal $\overline{CS}$ is a ECL logic low voltage (indicating a read cycle), single-sided delay control signal WED is provided at a CMOS level logic low voltage. When write enable signal $\overline{W}$ transitions from a logic high to a logic low voltage, single-sided delay control signal WED transitions from a logic low to a logic high after a built-in delay provided by delay stage 128. When write enable signal $\overline{W}$ transitions from a logic low to a logic high voltage, single-sided delay control signal WED transitions from a logic high voltage to a logic low voltage without a delay being provided by delay stage 128. Switching times are improved because intermediate logic levels from ECL logic gate 90 are used instead of full CMOS logic levels. An intermediate level logic high is equal to approximately $-0.8$ volts and an intermediate level logic low is equal to approximately $-2.4$ volts when $V_{DD}$ is equal to zero volts and $V_{SS}$ is equal to about $-5.2$ volts.

During a read cycle, (write enable signal $\overline{W}$ is an ECL logic high), internal write signal WI is an intermediate level logic low and internal write signal $\overline{WI}$ is an intermediate level logic high. In level converter 123, transistor 124 is conductive and transistor 125 is non-conductive. Transistor 126 is conductive, allowing a current to flow through transistors 124 and 126 between $V_{DD}$ and $V_{SS}$. Transistor 127 is conductive, thus pulling the voltage at the input of inverter 129 to a logic low voltage equal to approximately $V_{SS}$. A logic low at the input of inverter 129 causes the output of inverter 135 to be a logic high voltage equal to approximately $V_{DD}$. Inverters 127-135 operate at full rail CMOS logic levels. Transistors 136 and 137 are non-conductive, transistor 138 is conductive, thus reducing the voltage at the base of bipolar pull-up transistor 140 to $V_{SS}$, causing transistor 140 to be non-conductive. Single-sided delay control signal WED is therefore provided at the emitter of transistor 140 as a logic low.

At the same time, low power level converter 121 receives internal write signal WI and $\overline{WI}$ at the gates of transistors 142 and 141, respectively. Transistor 142 is conductive and transistor 141 is non-conductive. Transistors 143 and 144 are non-conductive, preventing any current flow between the power supply voltage terminals $V_{DD}$ and $V_{SS}$. Transistor 145 receives a logic low single-sided delay control signal WED and is conductive. Transistor 146 is therefore non-conductive. Transistors 149 and 150 are conductive, causing bipolar transistor 147 to be conductive, thus pulling single-sided delay control signal WED to a logic low.

To begin a write cycle of memory 20, write enable signal $\overline{W}$ and chip select signal $\overline{CS}$ are changed to logic low voltages. Therefore, transistors 93 and 98 are non-conductive, and transistor 94 is conductive, so that current $I_{95}$ is steered through transistor 94. The voltage at node N103 is a logic high voltage equal to approximately $V_{DD}$, and the voltage at node N104 is a logic low voltage equal to approximately $V_{DD}$ minus $I_{95}R_{92}$, where $R_{92}$ represents the resistance of resistor 92. Internal write signal WI is a logic high voltage equal to the voltage at node N103 minus one $V_{BE}$ across transistor 100, and internal write signal $\overline{WI}$ is a logic low voltage equal to the voltage at node N104 minus one $V_{BE}$ across transistor 101.

Transistor 124 is non-conductive and transistor 125 is conductive. Transistors 126 and 127 are both non-conductive so that there is no DC current flowing through level converter 123. Since transistor 124 is non-conductive, transistor 138 is also non-conductive. A logic high voltage approximately equal to $V_{DD}$ is provided to the input of inverter 129, thus a logic low voltage is provided by the output of inverter 135. Transistor 136 is conductive and transistor 137 is delayed becoming conductive for the time it takes for the outputs of the inverter chain comprising inverters 129–135 to change states. A conductive path is created between $V_{DD}$ and the base of transistor 140 when both transistors 136 and 137 become conductive, causing bipolar transistor 140 to be biased into conduction. Transistor 141 of low power level converter 121 is conductive and transistor 142 is non-conductive. Since single-sided delay control signal WED is a logic high, transistor 146 is conductive, causing transistors 143 and 144 to be conductive. The gate of transistor 149 is pulled to approximately $V_{SS}$, making transistor 149 substantially non-conductive. Transistor 145 is non-conductive, preventing a conductive path from being created between $V_{DD}$ and $V_{SS}$. Therefore, no DC current is allowed to flow in low power level converter 121. Since transistor 149 is non-conductive, bipolar transistor 147 is also non-conductive, allowing single-sided delay control signal WED to be pulled to approximately $V_{DD}$. Series connected CMOS inverters 127–135 delay transistor 137 from becoming conductive for approximately 4 nanoseconds. The length of the delay can be easily controlled by increasing or decreasing the number of inverters in the inverter chain.

When transitioning from a write cycle to a read cycle, single-sided delay control signal WED transitions from a logic high to a logic low in response to write enable signal $\overline{W}$ transitioning from a logic low to a logic high. No delay is desired when single-sided delay control signal WED transitions from a logic high to a logic low for the write to read transition. Going into a read cycle, transistor 136 becomes nonconductive immediately and transistor 138 becomes conductive immediately, thus reducing the voltage at the base of transistor 140 to $V_{SS}$. Transistor 140 becomes nonconductive, and output stage 145 causes single-sided delay control signal WED to be a logic low voltage.

Transistors 136 and 138 can change states very quickly because intermediate logic levels from ECL logic gate 90 are used. Using intermediate logic levels reduces the propagation delay encountered when full CMOS levels are used. But transistors 137 and 139 change states slowly because of series connected inventers 129–135. The base of transistor 140 cannot be charged to $V_{DD}$ until a logic low is provided at the output terminal of inverter 135. To discharge the base of transistor 140, transistor 138 switches on (becomes conductive) very quickly because the gate of transistor 138 is connected to the drain of transistor 124, and thus avoids the delay caused by series connected inverters 129–135.

Transistors 136–139 are connected to form CMOS two-input NOR gate 122. NOR gate 122 can operate at the intermediate logic level of signals WI and $\overline{WI}$. NOR gate 122 functions like a conventional NOR gate, except that the gate of transistor 138 is connected to the gates of transistors 126 and 127. If NOR gate 122 were a conventional NOR gate, the gate of transistor 138 would be connected to the gate of transistor 136. When internal write signal $\overline{WI}$ is a logic low, P-channel transistor 136 will become conductive, but the logic low is not low enough to make an N-channel transistor non-conductive. Therefore, the gate of transistor 138 is coupled to the gates of transistors 126 and 127, so that a voltage is provided to the gate of transistor 138 that will make transistor 138 non-conductive when transistor 136 is conductive.

Level converters 123 and 121 are interchangeable in most applications, however a draw back of low power level converter 121 is that it requires more area on the integrated circuit. In the preferred embodiment, low power level converter 121 is used with a conventional level converter 123 to reduce the power consumption of single-sided delay circuit 45, yet still be somewhat space efficient. In other embodiments, two low power level converters 121 can be used, further reducing the power consumption of single-sided delay circuit 45.

While the invention has been described in the context of a preferred embodiment, it will be apparent to those skilled in the art that the present invention may be modified in numerous ways and may assume many embodiments other than that specifically set out and described above. For example, other types of reference and bias voltage circuits may be substituted for those illustrated. Also, row address latching may be accomplished in a location other than the row predecoder. In addition, a different method for latching the predecoded row address signal may be used. Furthermore, delay stage 128 may be implimented using a series of ECL stages ahead of level converters 121 and 123. Accordingly, it is intended by the appended claims to cover all modifications of the invention which fall within the true spirit and scope of the invention.

We claim:

1. An asynchronous integrated circuit memory having a write cycle, indicated by a write enable signal being in a first logic state, for writing data into the memory, and a read cycle, indicated by the write enable signal being in a second logic state, for reading data from the memory, comprising:
   a plurality of memory cells, each memory cell of the plurality of memory cells coupled to a word line and to a bit line pair for receiving data from the bit line pair to which it is coupled, when the word line to which it is coupled is enabled;
   row decoding means for receiving a row address signal and for selecting one of said word lines in response to said row address signal;
   bit line equalization means, coupled to the bit line pairs, for equalizing the voltages on the bit line pairs at the termination of the write cycle; and
   preventing means, coupled to said row decoding means, for preventing said row decoding means from selecting a different one of said word lines until said write enable signal changes from said first logic state to said second logic state, ensuring that said bit line equalization means equalizes the voltages on the bit line pairs before said different one of said word lines is selected.

2. The memory of claim 1, wherein said row decoding means further comprises:
   a row address predecoder having an input for receiving said row address signal and having an output for providing a predecoded row address signal; and
   a row selector coupled to said row address predecoder for receiving said predecoded row address signal, for performing a word line selection, and for changing such word line selection in response to a change in said row address signal.

3. The memory of claim 1, further comprising control means for providing a first control signal to said preventing means and for making said first control signal active a first predetermined delay after said write enable signal transitions from said second logic state to said first logic state, said control means making said first control signal inactive after a second predetermined delay, said second predetermined delay being less than said first predetermined delay.

4. The memory of claim 3, wherein said preventing means is further characterized as preventing said row decoding means from selecting a different one of said word lines in response to said first control signal being active.

5. The memory of claim 2, wherein said preventing means is coupled between said output of said row address predecoder and said row selector, and prevents said predecoder row address signal from being received by said row selector in response to receiving a first control signal.

6. The memory of claim 2, wherein said row address predecoder comprises a NAND logic gate having a plurality of input terminals for receiving a plurality of said row address signals and an output terminal for providing said precoded row address signal as a logical NAND of said plurality of said row address signals.

7. The memory of claim 5, wherein said preventing means comprises:
   a transfer gate coupled to said output of said row address predecoder, for receiving said first control signal, and for preventing said row address predecoder from providing a new predecoded row address signal to said row selector when said first control signal is active; and
   a latch for retaining said predecoded row address signal until a new predecoded row address signal is provided by said row address predecoder.

8. The memory of claim 7, wherein said transfer gate comprises:
   a P-channel transistor having a first current electrode coupled to said output of said row address predecoder, a second current electrode coupled to said row selector, and a control electrode for receiving said first control signal;
   an inverter having an input terminal for receiving said first control signal and an output terminal; and
   an N-channel transistor having a first current electrode coupled to said output of said row address predecoder, a second current electrode coupled to said row selector, and a control electrode coupled to said output of said inverter.

9. An integrated circuit memory having a write cycle, indicated by a write enable signal being in a first logic state, for writing data into the memory, and a read cycle, indicated by the write enable signal being a second logic state, for reading data from the memory, comprising:
   a plurality of memory cells, each memory cell of the plurality of memory cells coupled to a word line and to a bit line pair, for receiving data from the bit line pair to which it is coupled, when the word line to which it is coupled is enabled;
   a row address predecoder for receiving a row address signal and in response providing predecoded row address signals;
   a row selector coupled to said row address predecoder for receiving said predecoded row address signals, for performing a word line selection, and for changing such word line selection in response to a change in said row address signal;
   bit line equalization means, coupled to the bit line pairs, for equalizing the voltages on the bit line pairs at the termination of the write cycle;
   decoupling means, for decoupling said row address predecoder from said row selector when said write enable signal is in said first logic state; and
   latching means, for retaining said word line section until after said write enable signal switches to said second logic state.

10. The memory of claim 9, wherein said row address predecoder comprises a NAND logic state having a plurality of input terminals for receiving a plurality of said row address signals and an output terminal for providing a predecoded row address signal as a logical NAND of said plurality of row address signals.

11. The memory of claim 9, further comprising control means for making a first control signal active a first predetermined delay after said write enable signal transitions from said second logic state to said first logic state, said control means making said first control signal inactive after a second predetermined delay, said second predetermined delay being less than said first predetermined delay.

12. The memory of claim 11, wherein said decoupling means is further characterized as decoupling said row address predecoder from said row selector in response to said first control signal being active.

13. The memory of claim 12, wherein said latching means comprises a latch for retaining said predecoded row address signal until a new predecoded row address signal is provided by said row decoder.

14. The memory of claim 12, wherein said decoupling means comprises:
   a first transistor having a first current electrode coupled to said output of said row address predecoder, a second current electrode coupled to said row selector, and a control electrode for receiving said first control signal;
   an inverter having an input terminal for receiving said first control signal and an output terminal; and
   a second transistor having a first current electrode coupled to said output of said row address predecoder, a second current electrode coupled to said row selector, and a control electrode coupled to said output of said inverter.

15. The memory of claim 13, wherein said latch comprises:
   a first inverter having an input terminal for receiving said predecoded row address signal and an output terminal;
   a bipolar transistor having a first current electrode coupled to a first power supply voltage terminal, a second current electrode coupled to said row selector for providing said predecoded row address signal, and a control electrode coupled to the output terminal of said first inverter;
   a first N-channel transistor having a first current electrode coupled to said output of said first inverter, a second current electrode coupled to said second current electrode of said bipolar transistor, and a control coupled to said input of said first inverter;

a second N-channel transistor having a first current electrode coupled to said second current electrode of said bipolar transistor, a second current electrode coupled to a second power supply voltage terminal, and a control electrode coupled to said input of said first inverter; and a second inverter having an input terminal coupled to said second current electrode of said bipolar transistor and an output terminal coupled to said input terminal of said first inverter.

16. An asynchronous integrated circuit memory having a write cycle, indicated by a write enable single being in a first logic state, for writing data into the memory, and a read cycle, indicated by the write enable signal being in a second logic state, for reading data from the memory, comprising:

a plurality of memory cells, each memory cell of the plurality of memory cells coupled to a word line and to a bit line pair, for receiving data from the bit line pair to which it is coupled, when the word line to which it is coupled is enabled;

a row address buffer for receiving a row address signal and in response providing buffered complementary row address signals;

a row predecoder for receiving said buffered complementary row address signals and for providing predecoded signals for selecting one of the word lines;

a row selector coupled to said row predecoder, for receiving said predecoded row address signals, for performing a word line selection, and for changing such word line section in response to a change in said row address signal;

bit line equalization means, coupled to the bit line pairs, for equalizing the voltages on the bit line pairs at the termination of the write cycle;

a transfer gate coupled to said output of said row predecoder for receiving a first control signal and for preventing said row address predecoder from providing a new predecoder row address signal to said row selector when said first control signal is active;

control means, for making said first control signal active in response to said write enable signal being in said first logic state, and for making said first control signal inactive in response to said write enable signal being in said second logic state, said first control signal being delayed for a predetermined time after said write enable signal transitions from said second logic state to said first logic state; and a latch for retaining said predecoded row address signal until a new predecoded row address signal is provided by said row predecoder.

17. The memory of claim 16, wherein said row address predecoder comprises a NAND logic gate having a plurality of input terminals for receiving a plurality of said row address signals and an output terminal for providing the predecoded row address signal as a logical NAND of said plurality of row address signals.

18. The memory of claim 16, wherein said transfer gate comprises:

a first transistor having a first current electrode coupled to said output of said row address predecoder, a second current electrode coupled to said row selector, and a control electrode for receiving said first control signal;

an inverter having an input terminal for receiving said first control signal and an output terminal; and a second transistor having a first current electrode coupled to said output of said row address predecoder, a second current electrode coupled to said row selector, and a control electrode coupled to said output of said inverter.

19. The memory of claim 16, wherein said latch comprises:

a first inverter having an input terminal for receiving said predecoded row address signal and an output terminal;

a bipolar transistor having a first current electrode coupled to a first power supply voltage terminal, a second current electrode coupled to said row selector for providing said predecoded row address signal, and a control electrode coupled to the output terminal of said first inverter;

a first N-channel transistor having a first current electrode coupled to said output of said first inverter, a second current electrode coupled to said second current electrode of said bipolar transistor, and a control electrode coupled to said input of said first inverter;

a second N-channel transistor having a first current electrode coupled to said second current electrode of said bipolar transistor, a second current electrode coupled to a second power supply voltage terminal, and a control electrode coupled to said input of said first inverter; and a second inverter having an input terminal coupled to said second current electrode of said bipolar transistor and an output terminal coupled to said input terminal of said first inverter.

* * * * *

UNITED STATES PATENT AND TRADEMARK OFFICE
CERTIFICATE OF CORRECTION

PATENT NO. : 5,268,863
DATED : December 7, 1993
INVENTOR(S) : Mark Douglas Bader, Kenneth Wade Jones, Karl Wang, Ray Chang It is certified that error appears in the above-indentified patent and that said Letters Patent is hereby corrected as shown below:

In claim 16, column 17, line 32, change "section" to --selection--.

Signed and Sealed this

Second Day of August, 1994

Attest:

BRUCE LEHMAN

Attesting Officer — Commissioner of Patents and Trademarks